United States Patent [19]

Savage et al.

[11] 4,308,474
[45] Dec. 29, 1981

[54] RARE EARTH-IRON MAGNETOSTRICTIVE MATERIALS AND DEVICES USING THESE MATERIALS

[75] Inventors: Howard T. Savage, Greenbelt; Arthur E. Clark, Adelphi, both of Md.; O. Dale McMasters, Ames, Iowa

[73] Assignee: The United States of America as represented by the Secretary of the Navy, Washington, D.C.

[21] Appl. No.: 94,250

[22] Filed: Nov. 14, 1979

[51] Int. Cl.³ .................. H01L 41/20; H04B 11/00
[52] U.S. Cl. .................................. 310/26; 75/123 E
[58] Field of Search ................... 310/26; 333/148; 148/100; 252/62.55; 75/123 E, 152; 366/127

[56] References Cited

U.S. PATENT DOCUMENTS

| | | | |
|---|---|---|---|
| 3,102,002 | 8/1963 | Wallace et al. | 75/123 E |
| 3,869,683 | 3/1975 | Sokoloski | 310/26 X |
| 3,949,351 | 4/1976 | Clark et al. | 333/148 |
| 4,078,186 | 3/1978 | Folen et al. | 310/26 X |
| 4,158,368 | 6/1979 | Clark | 310/26 X |

Primary Examiner—Mark O. Budd
Attorney, Agent, or Firm—R. S. Sciascia; A. L. Branning; R. D. Johnson

[57] ABSTRACT

Grain-oriented polycrystalline or single crystal magnetostrictive materials on the general formula $Tb_xDy_{1-x}Fe_{2-w}$, $Tb_xHo_{1-x}Fe_{2-w}$, $Sm_xDy_{1-x}Fe_{x-w}$, $Sm_xHo_{1-x}Fe_{2-w}$, $Tb_xHo_yDy_zFe_{2-w}$, or $Sm_xHo_yDy_zFe_{2-w}$, wherein $0 \leq w \leq 0.20$, and $x+y+z=1$. X, y, and z are selected to maximize the magnetostrictive effect and the magnetomechanical coupling coefficient $K_{33}$. These material may be used in magnetostrictive transducers, delay lines, variable frequency resonators, and filters.

102 Claims, 5 Drawing Figures

RARE EARTH-IRON MAGNETOSTRICTIVE MATERIALS AND DEVICES USING THESE MATERIALS

BACKGROUND OF THE INVENTION

This invention relates to magnetostrictive materials and more particularly to rare earth iron magnetostrictive materials.

While conventional magnetostrictive materials—such as nickel, cobalt, iron, and alloys of these metals—have magnetostrictions at room temperature (which is the operating temperature of most transducer devices) which enable them to be used in transducer devices, it has always been desirable to obtain other magnetostrictive materials which have greater magnetostriction then those presently in use.

In 1963, it was discovered by A. E. Clark, R. Bozorth, and B. DeSavage, Phys. Letters 5, 100 (1963), that certain heavy rare earth elements have magnetostrictions about 1000 times greater than Fe and about 200 times greater than Ni. However, these enormous magnetostrictions are only present at cryogenic temperatures and are most pronounced in the neighborhood of absolute zero. At room temperature, the rare earth elements have little magnetostriction since their magnetic ordering temperatures fall below room temperature. Therefore, all are far inferior to iron, nickel, cobalt, and their alloys.

A search for materials with high magnetostriction at room temperatures was started. Highly magnetostrictive rare earths, such as Tb and Dy, were combined with the magnetic transition metals: iron, cobalt, and nickel. Of all the known rare earth transition metal compounds, the iron compounds were found to have the largest magnetostriction at room temperature.

The usefulness of these prior art rare earth-iron materials in magnetostrictive devices (e.g., transducers, delay lines, oscillators) is limited at low magnetic fields because the crystallites of which the material is composed have a random distribution of principal axes. Because the magnetostriction is anisotropic, large inhomogenous strains are developed in the material as the temperature is lowered below the Curie point. The large inhomogenous strains hinder domain wall movement. Since domain wall motion is necessary to achieve transduction, the random polycrystals do not achieve the efficiency and dynamic range possible from rare-earth iron materials.

SUMMARY OF THE INVENTION

Accordingly, an object of this invention is to provide a novel magnetostrictive material.

Another object of this invention is to provide a magnestrictive material having easier domain wall motion than prior art rare earth-iron materials.

Yet another object of this invention is to provide magnetostrictive materials having lower inhomogeneous magnetostrictive strains.

Still another object of this invention is to provide rare earth-iron magnetostrictive materials having greater coupling ($K_{33}$) coefficients.

Yet another object of this invention is to provide magnetostrictive rare earth-iron materials having greater relative permeabilities ($\mu_r$).

Moreover, another object of this invention is to provide materials which exhibit greater magnetostrictive strains at room temperature and low magnetic fields.

These and other objectives of this invention are obtained by providing a grain-oriented polycrystalline or a single crystal material selected from
 (1) $Tb_xDy_{1-x}Fe_{2-w}$, wherein $0.20 \leq x \leq 1.00$;
 (2) $Tb_xHo_{1-x}Fe_{2-w}$, wherein $0.10 \leq x \leq 1.00$;
 (3) $Sm_xDy_{1-x}Fe_{2-w}$, wherein $0.80 \leq x \leq 1.00$;
 (4) $Sm_xHo_{1-x}Fe_{2-w}$, wherein $0.60 \leq x \leq 1.00$;
 (5) $Tb_xHo_yDy_zFe_{2-w}$, wherein $0.10 \leq x < 1.00$, $0 \leq y \leq 0.9$, and $0 \leq z \leq 0.80$; and
 (6) $Sm_xHo_yDy_zFe_{2-w}$, wherein $0.60 \leq x < 1.00$, $0 \leq y \leq 0.4$, and $0 \leq z \leq 0.40$;
 wherein $0 \leq w \leq 0.20$ for (1) through (6); and provided that $x+y+z=1$ for (5) and (6).

The materials of the present invention may be used to make the magnetostrictive elements of magnetostrictive transducers, delay lines, variable frequency oscillators, and filters.

BRIEF DESCRIPTION OF THE DRAWINGS

FIGS. 1 through 5 are discussed in the examples.

DETAILED DESCRIPTION OF THE PREFERRED EMBODIMENT

First, a conventional random-oriented crystalline rare earth-iron alloy of the desired composition is prepared by arc melting or arc casting. The arc casting is carried out in an inert environment (e.g., dry argon or helium).

Next the random-oriented polycrystalline material is converted into either a grain-oriented polycrystalline alloy or a single crystal alloy material. The grain-oriented polycrystalline rare earth-iron alloy is prepare from the randomcrystalline alloy by using a conventional Horizontal Zone Melting method (described in Example 1). The long axis of the grains of the resulting structure exhibit a strong preferential orientation along the boule axis; most of the grains have their principal axis being at small angles from boule axis.

Because the sample is grain-oriented, the crystallites do not strain against each other as the magnetostriction grows larger when the temperature is lowered. Therefore, the domain walls move easier with the application of a given field. As a result, coupling factors as high as 0.75 have been observed for these grain-oriented polycrystalline alloys as compared with 0.6 in random polycrystals. The coupling factor is a measurement of the efficiency of the transducer action of the material; 0.75 is an exceptionally high value for a coupling factor. Also, because most of the crystals have their principal axis directed close to the $\lambda_{111}$ axis, and because the $\lambda_{111}$ axis provides a much greater magnetostrictive effect than the $\lambda_{100}$ axis, grain-orientation also provides a greater magnetostrictive effect.

Treatment of the arc-cast random-oriented polycrystal rare earth-iron materials by the conventional Bridgman method (described in Example 2) produces a single crystal in nature alloy with small angle grain boundaries of less than 5°. The principal axes of the Laves phase of these almost single crystal materials should lie close to the growth axis of the material which, in turn, lies within 10° of the $\lambda_{111}$ axis. Although seed crystals were not used in example 2 (Bridgman method), it is desirable that they be used to achieve a growth axis still closer to the $\lambda_{111}$ axis, as this will increase of magnetostrictive effect still further.

In these single crystal materials, all the crystalline axes are pointed in nearly the same direction. Therefore, large inhomogeneous strains do not develop as the temperature is lowered as is the case in the random polycrystalline materials. As a result the domain walls move more freely and resultant coupling factors are as high as 0.75, the largest ever reported in magnetostrictive transducers. Again, the coupling factor is a measure of the efficiency of the transducer action.

The compositions for both the grain-oriented polycrystalline and the single crystal alloys are as follows:

(1) $Tb_xDy_{1-x}Fe_{2-w}$, wherein $0.20 \leq x \leq 1.0$, but preferably $0.20 \leq x \leq 0.30$, and $0 \leq w \leq 0.20$, but preferably $0 \leq w \leq 0.10$;

(2) $Tb_xHo_{1-x}Fe_{2-w}$, wherein $0.10 \leq x \leq 1.00$, but preferably $0.10 \leq x \leq 0.20$, and $0 \leq w \leq 0.20$, but preferably $0 \leq w \leq 0.10$;

(3) $Sm_xDy_{1-x}Fe_{2-w}$, wherein $0.80 \leq x \leq 1.00$, but preferably $0.80 \leq x \leq 0.90$, and $0 \leq w \leq 0.20$, but preferably $0 \leq w \leq 0.10$;

(4) $Sm_xHo_{1-x}Fe_{2-w}$, wherein $0.60 \leq x \leq 1.00$, but preferably $0.60 \leq x \leq 0.80$, and $0 \leq w \leq 0.20$, but preferably $0 \leq w \leq 0.10$;

(5) $Tb_xHo_yDy_zFe_{2-w}$, wherein $0.10 \leq x \leq 1.00$, but preferably $0.15 \leq x \leq 0.25$; $0 \leq y \leq 0.90$, but preferably $0.55 \leq y \leq 0.65$; $0 \leq z \leq 0.80$, but preferably $0.15 \leq z \leq 0.25$; and $0 \leq w \leq 0.20$, but preferably $0 \leq w \leq 0.10$; provided that $x+y+z=1$; or (6) $Sm_xHo_yDy_zFe_{2-w}$, wherein $0.60 \leq x \leq 1.00$, but preferably $0.70 \leq x \leq 0.90$; $0 \leq y \leq 0.40$, but preferably $0.20 \leq y \leq 0.40$; $0 \leq z \leq 0.40$, but preferably $0 \leq z \leq 0.20$; and $0 \leq w \leq 0.20$, but preferably $0 \leq w \leq 0.10$; provided that $x+y+z=1$.

In formulations (1), (2), (3), and (4), the subscripts x, 1-x, and 2-w represent the relative atomic amounts of the constituents. Similarly, in formulations (5) and (6), the subscripts x, y, z and 2-w represent the relative atomic amounts of the constituents. Note that x, y, and z are selected to minimize the anisotropy and yet maintain a large room temperature magnetostriction.

The grain-oriented polycrystalline alloys and the single crystal alloys can be used in magnetostrictive devices such as magnetostrictive transducers, variable delay lines, variable frequency oscillators, and filters. For instance, magnetostrictive transducer vibrator elements using the materials of the present invention exhibit large magnetostrictive strains at relatively low magnetic fields, a substantial improvement over conventional transducers. The materials of the present invention may also be used to improve the performance of variable, magnetostrictive delay lines for sound waves. One such delay line is disclosed in U.S. Pat. No. 3,949,351, entitled "Variable Delay Line," which issued to Arthur E. Clark and Howard T. Savage on Apr. 6, 1976, herein incorporated by reference.

The general nature of the invention having been set forth, the following examples are presented as specific illustrations thereof. It will be understood that the invention is not limited to these specific examples but is susceptible to various modifications that will be recognized by one of ordinary skill in the art.

EXAMPLE 1

Grain-Oriented Polycrystalline $Tb_{0.27}Dy_{0.73}Fe_{1.98}$

A partially grain-oriented $Tb_{0.27}Dy_{0.73}Fe_{1.98}$ sample was prepared by a horizontal zone method, using a supporting "cold finger" to hold the zone in place. First, the appropriate amounts of Tb, Dy, and Fe were converted by conventional arc-melting into homogeneous buttons composed of a random polycrystalline alloy having the composition $Tb_{0.27}Dy_{0.73}Fe_{1.98}$. The buttons were then drop cast into 0.25 inch diameter split copper rods to form rods. Two such $Tb_{0.27}Dy_{0.73}Fe_{1.98}$ rods, each about 2.5 inches long, were placed in a horizontal multiple copper tube cold crucible. The zone melting operation was carried out under an argon atmosphere. Induction heating was used to melt the sample with the zone rate depending on the power level. Because a uniform shape is desired, the molten zone width was observed and the induction heating coil was advanced at such a rate (about 1 cm/minute) as to maintain a constant zone width. The apparatus used (induction heater, crucible, etc.) was the same as that described by O. D. McMasters, G. E. Holland, and K. A. Gschneidner, in "Single Crystal Growth by the Horizontal Levitation Zone Melting Method," Journal of Crystal Growth 43 (1978) pp. 577–583, herein incorporated by reference. The resulting boule was elliptical in shape, approximately 10 cm long and 0.6 cm in average diameter. The sample possessed a grain structure with a strong preferential orientation. The grains were not equiaxed but elongated with an aspect ratio of from 2-1 to 5-1. The long axis varied roughly from 0.5 to 2 mm. The direction of the long axis of the grains in the top half of the boule lied at small angles relative to the boule axis. However, a substantial change in the grain orientation was found to occur in the half of the boule nearest the "cold finger". Here the grains tended to point perpendicular to the boule axis.

EXAMPLE 2

Single crystal $Tb_{0.20}Dy_{0.22}Ho_{0.58}Fe_{1.95}$

A single crystal sample of $Tb_{0.20}Dy_{0.22}Ho_{0.58}Fe_{1.95}$ was prepared by a method which was Bridgman in nature. First, the appropriate amounts of Tb, Dy, Ho, and Fe were converted by conventional arc-melting into homogeneous buttons composed of a random polycrystalline alloy having the composition $Tb_{0.20}Dy_{0.22}Ho_{0.58}Fe_{1.95}$. An arc-melt button was then melted into a groove in a water-cooled copper hearth to yield a rod about 0.4 inches in diameter and 4 inches long. This rod was placed in a boron-nitride (BN) tapered crucible with a pointed end. Approximate dimensions of the crucible were 0.5 inches in diameter, 3 inches long with a 45° cone angle. The charge was melted by induction heating under an argon atmosphere. The crucible was contained in a tantalum heater which was supported on a water cooled copper probe which was lowered out of the hot zone at a rate of 0.2 cm/min. The resultant boules were from 5 to 8 cm long with an average cross section of about 1 cm. The boule is single crystal in nature with small angle grain boundaries of less than 5°. A <111> direction was found perpendicular to the growth axis. The growth axis is about <123>. Coupling factor measurements (to be discussed later) show this to be a favorable growth axis. This method of preparation yields a large, relatively homogeneous boule that could be used in its entirety. The horizontal zone method (Example 1) does not yield a homogeneous boule.

Magnetic properties the materials produced in Examples 1 and 2

Figure 1:
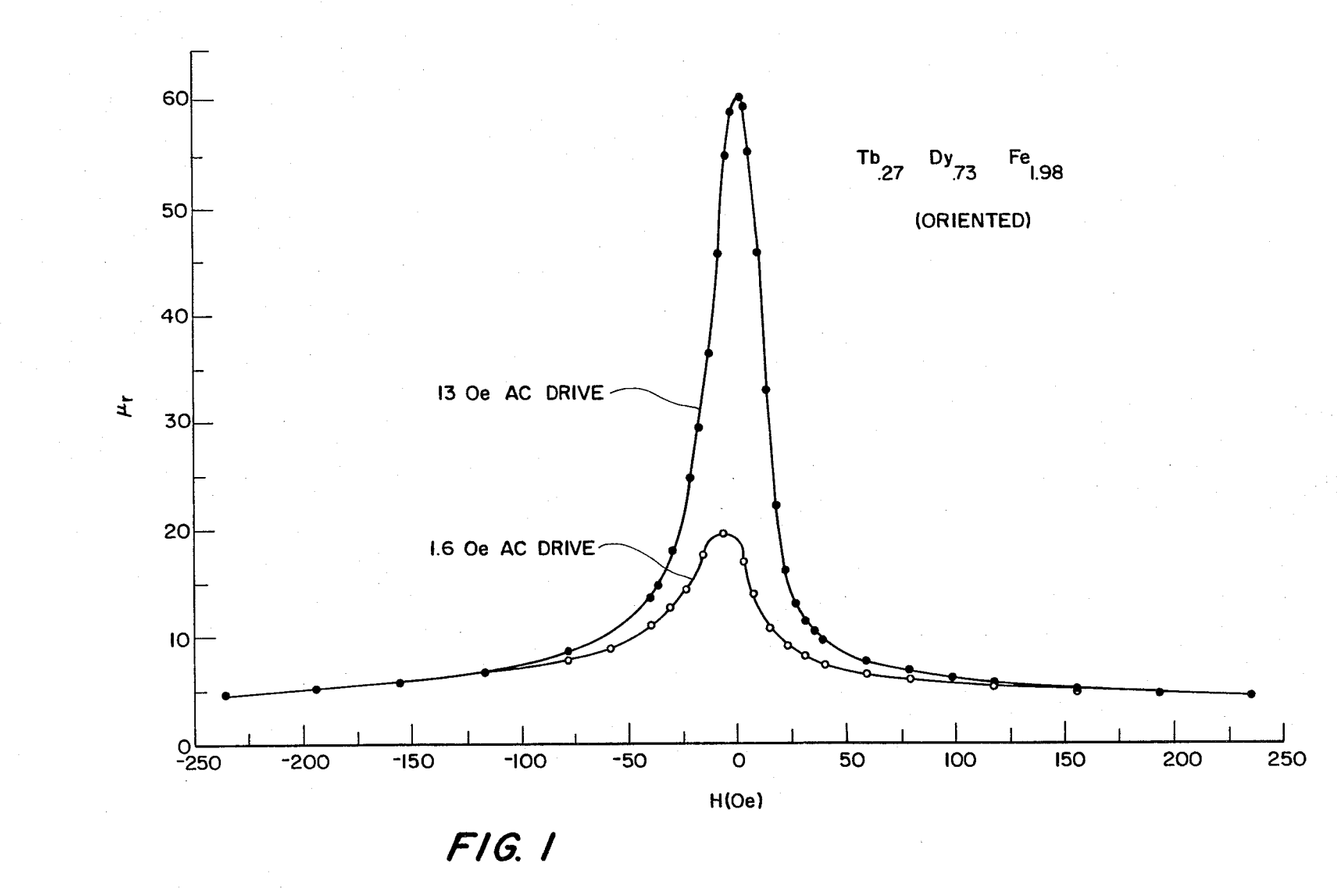
FIG. 1 is a graph showing the relative permeability at constant stress as a function of applied bias for a partially grain-oriented polycrystalline $Tb_{.27}Dy_{.73}Fe_{1.98}$ sample.

The $Tb_{0.27}Dy_{0.73}Fe_{1.98}$ sample was cut horizontally along the boule axis so that measurements could be made on the top half, in which the grains point along the axis. The peak relative permeability of this section was found to be 19 when a low ac drive of 1.6 Oe rms was used. However a substantial increase in $\mu_r$ was seen as the ac drive was increased. FIG. 1 shows the relative permeability at constant stress as a function of the applied bias field for a 1.6 and 13 Oe rms ac drive level. Using the higher drive results in a $\mu_r=61$, with the peak occurring at a very low bias field of $\approx 2$ Oe. These values represent at least a 2-fold increase in relative permeability over the random polycrystal crystal of the same composition in which $\mu_r=6$ to 10.

Figure 2:
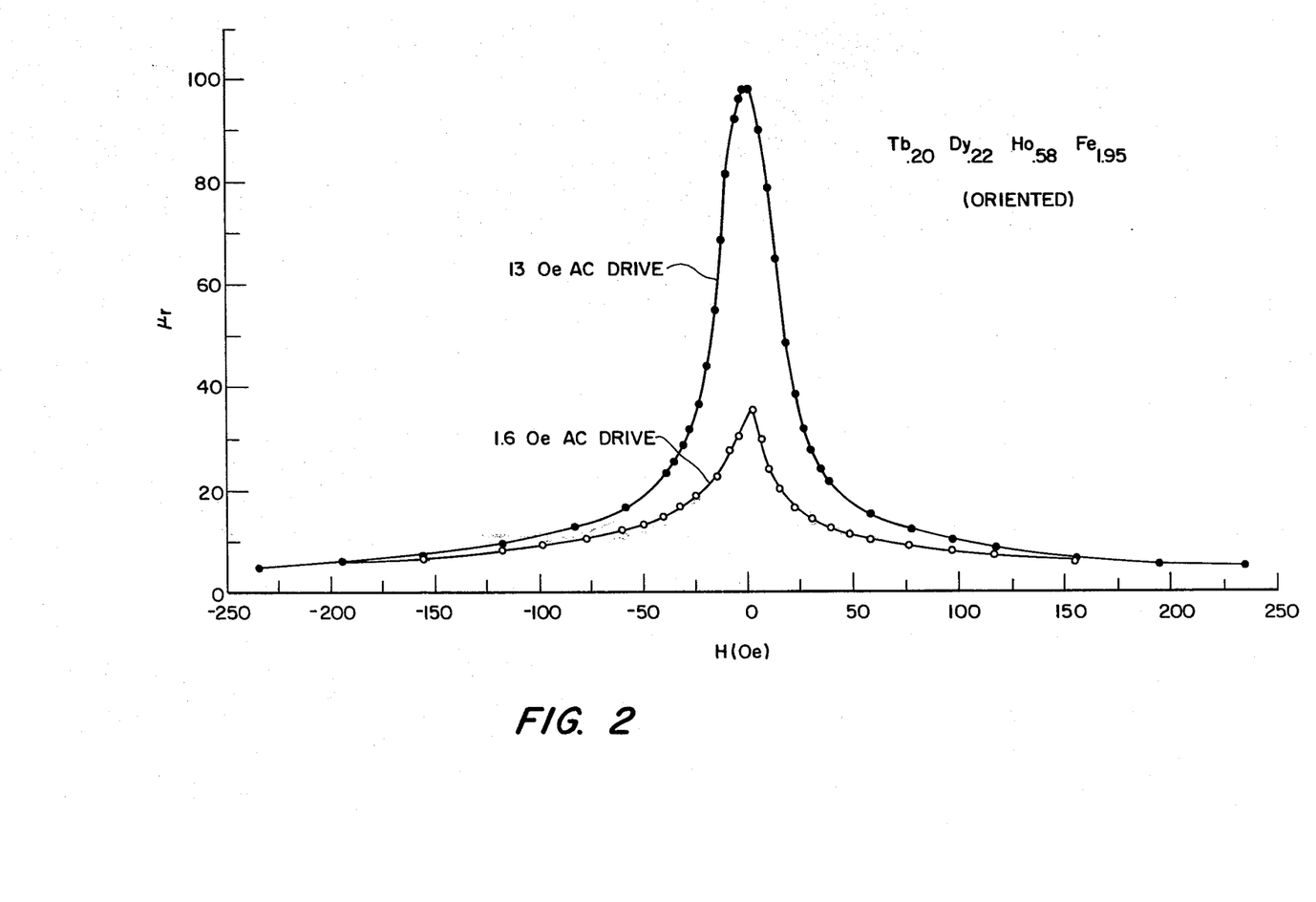
FIG. 2 is a graph showing the relative permeability at constant stress as a function of applied bias for a single crystal $Tb_{0.20}Dy_{0.22}Ho_{0.58}Fe_{1.95}$ sample.

Quite similar results were obtained for the almost single crystal $Tb_{0.20}Dy_{0.22}Ho_{0.58}Fe_{1.95}$ alloy as shown in FIG. 2, where the relative permeability, $\mu_r$, is again plotted at constant stress for two different drive levels. At the low ac drive of 1.6 Oe rms the relative permeability of 36 was obtained. Again in this sample $\mu_r$ displays a strong dependence upon the ac drive level. A peak permeability of 98 was obtained with a 13 Oe rms ac drive. This sharp increase only occurs for a bias field <100 Oe. At higher bias $\mu_r$ shows little ac drive dependence. This behavior is true for the ternary as well as the quaternary and we believe that this is the first time that such a dramatic increase in $\mu_r$ (as a function of drive) has been observed. We speculate that internal strains are being overcome, allowing the domain walls to move easily in comparison with the low drive situation.

Both of these partially oriented samples were found to possess substantially larger magnetomechanical coupling coefficients ($K_{33}$) than has previously been observed in their random polycrystalline counterparts.

Figure 3:
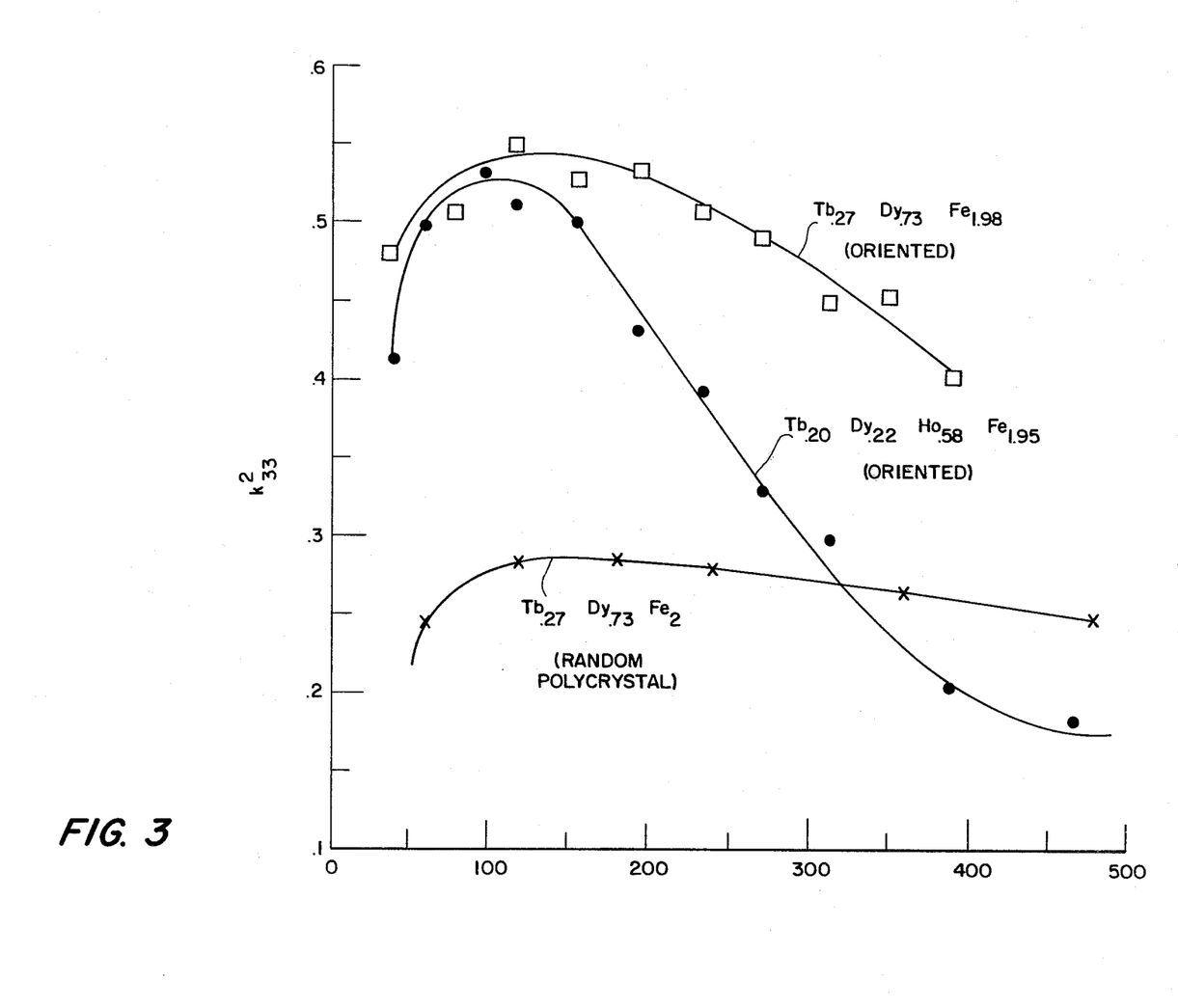
FIG. 3 is a graph comparing the magnetomechanical coupling factors as a function of the applied bias between the partially grain-oriented polycrystalline $Tb_{0.27}Dy_{0.73}Fe_{1.98}$ and the single crystal $Tb_{0.20}Dy_{0.22}Ho_{0.58}Fe_{1.95}$ samples and a randomly-oriented polycrystalline $Tb_{0.27}Dy_{0.73}Fe_{2.0}$ sample.

FIG. 3 shows a comparison of the coupling factors ($K_{33}^2$) as a function of applied bias between these two partially oriented samples and a typical arc-cast $Tb_{0.27}Dy_{0.73}Fe_2$ random polycrystal. The peak coupling in the random polycrystal is $k_{33}^2=0.28$. However in the two oriented samples $k_{33}^2=0.54$ at 125 Oe bias for the ternary, while $k_{33}^2=0.53$ at 100 Oe bias for the quaternary. All the coupling measurements were performed using a 1.6 Oe rms ac drive. The lower part of the boule which had a different grain configuration had a peak value of $k_{33}^2$ of 0.43. Apparently the presence of the "cold finger" is detrimental in obtaining optimum grain orientation. The quaternary sample peaks at a slightly smaller bias due to the smaller magnetocrystalline anisotropy for this composition. It should be noted that the peak in the coupling coefficient occurs at a much higher bias than the peak relative permeability. This is brought about by the fact that the coupling is essentially zero when the magnetic moment is zero.

Figure 4:
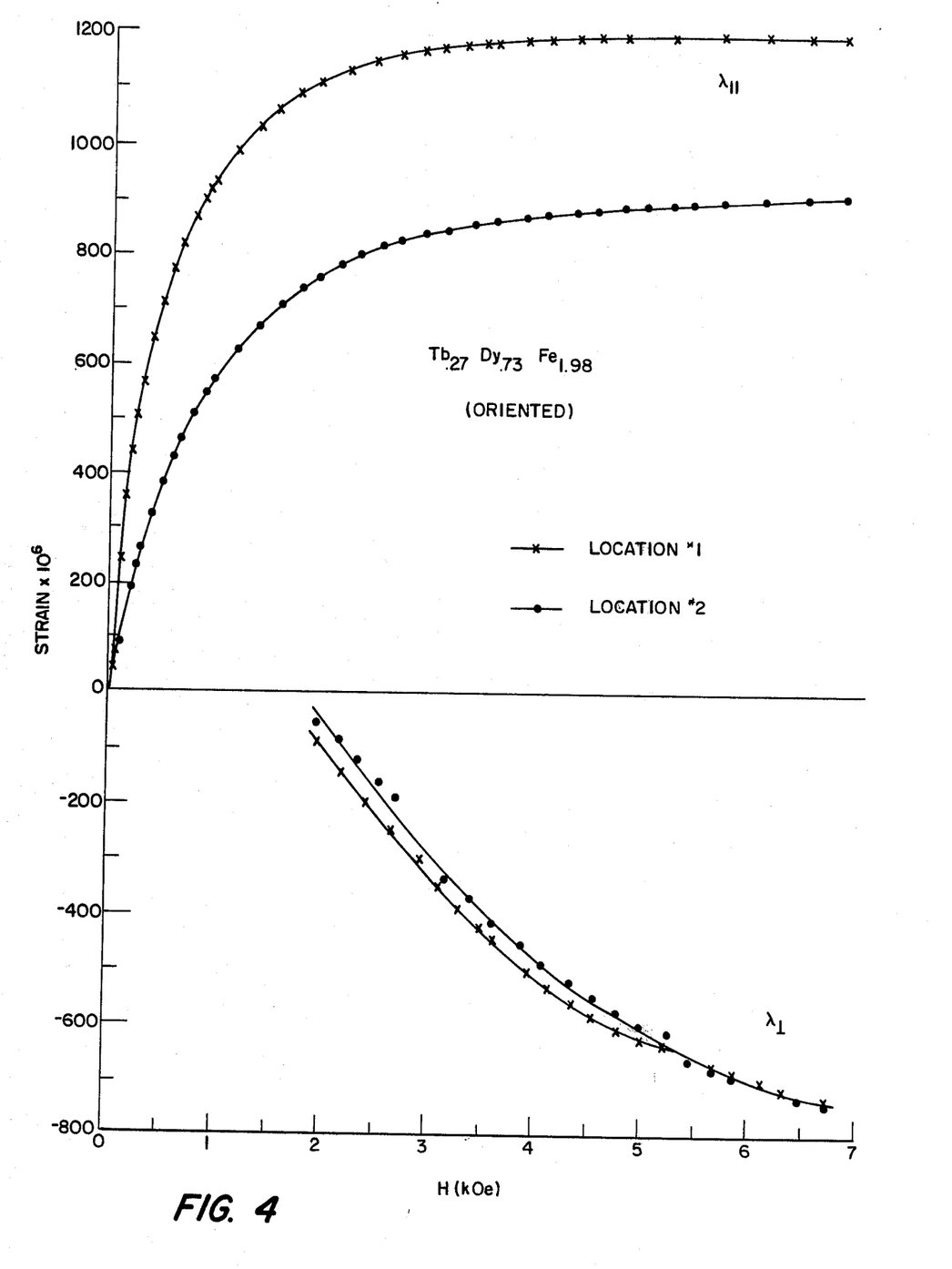
FIG. 4 is a graph showing magnetostriction as a function of applied field for a partially grain-oriented polycrystalline $Tb_{0.27}Dy_{0.73}Fe_{1.98}$ sample.

As previously stated the composition for both alloys was chosen to minimize the anisotropy yet maintain the large room temperature magnetostriction. FIG. 4 shows the results of magnetostriction measurements on the partially oriented $Tb_{0.27}Dy_{0.73}Fe_{1.98}$ sample. The strain as a function of applied field is shown for two different strain gauge locations positioned along the axis of the sample. The upper curves show $\lambda_{\parallel}$, the strain which results when the magnetic field is applied parallel to the long axis of the sample, which is the strain obtained when the applied field is directed along the axis of the rod. The lower curves $\lambda_{\perp}$, are the strains obtained when the field is applied perpendicular to the long axis of the sample. As can be seen in the figure, the large demagnetizing field $\approx 4.5$ kOe that results when the field is applied perpendicular to the long axis of the rod, prevents saturation of $\lambda_{\perp}$. However we estimate the saturation value of $\lambda_{\perp}$, the strain which results when the magnetic field is applied perpendicular to the long axis, to be $-800\times 10^{-6}$ for both locations. FIG. 4 clearly indicates that the gauges sampled grains with quite different orientations. Location #1 was a region of favorable grain orientation yielding $\lambda_s = \frac{3}{2}(\lambda_{\parallel} \| \lambda_{\perp}) = 1.3\times 10^{-3}$. This value of $\lambda_s$ is equal to 0.83 $\lambda_{111}$ indicating that the orientation is close to a $\lambda_{111}$ direction. Less favorable results were obtained for location #2 where $\lambda_s = 1.1 \times 10^{-3}$. Measurements on random polycrystals yield a $\lambda_s = 1.0\times 10^{-3}$.

Figure 5:
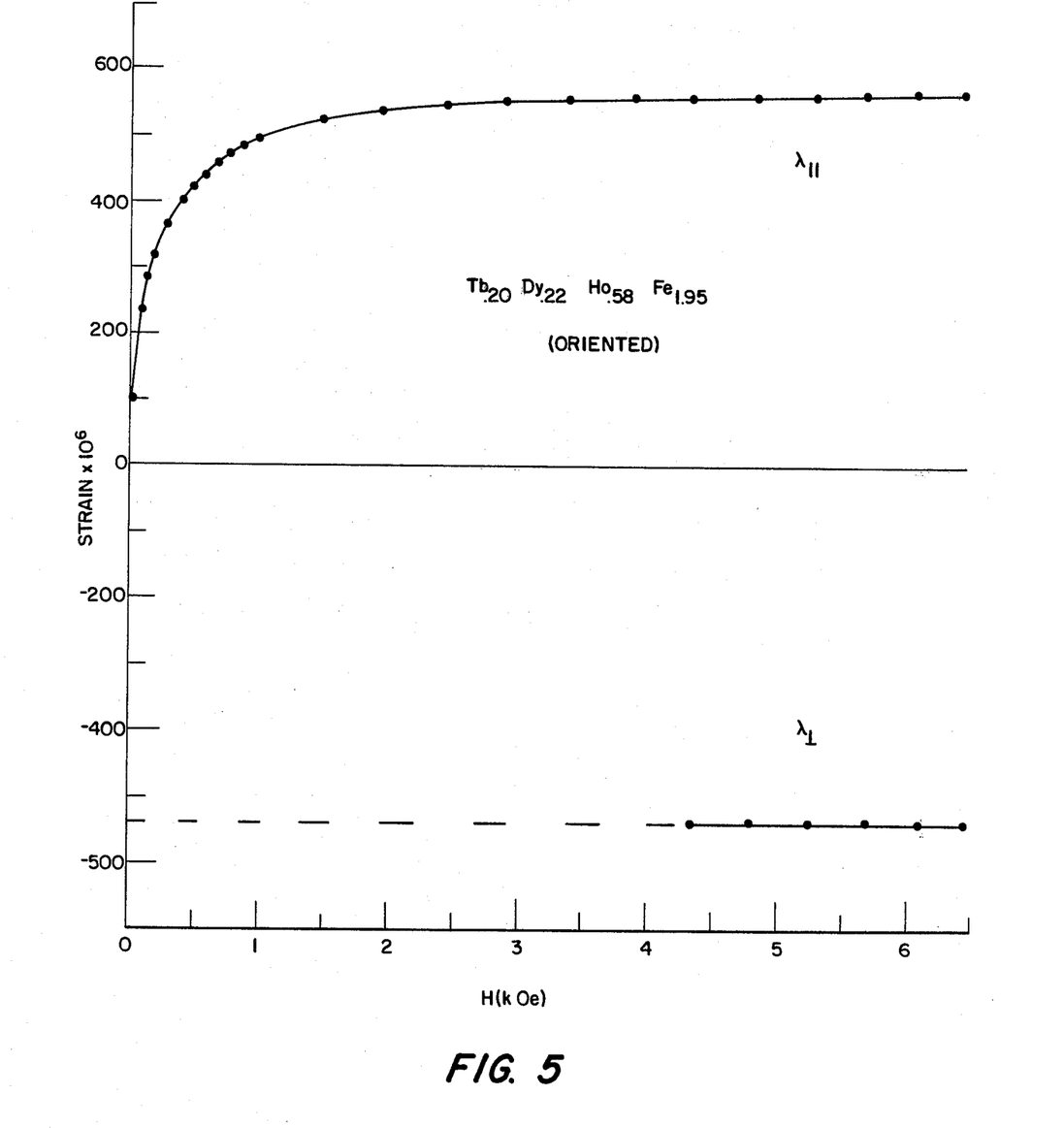
FIG. 5 is a graph showing the magnetostriction as a function of applied field for the single crystal $Tb_{0.20}Dy_{0.22}Ho_{0.58}Fe_{1.95}$ sample.

The d constant is defined as the slope of the magnetostriction curve ($d\lambda/dH$). The d constant is an important figure of merit in applications. In the vicinity of maximum coupling values of d are somewhat greater than $2\times 10^{-6}$ $Oe^{-1}$ in location 1 and somewhat greater than $10^{-6}$ $Oe^{-1}$ in region 2. FIG. 5 shows a plot of the magnetostriction as a function of applied field for the oriented $Tb_{0.20}Dy_{0.22}Ho_{0.58}Fe_{1.98}$ sample. Both $\lambda_{\parallel}$ and $\lambda_{\perp}$ are easily saturated with the available fields due to the small magnetic anisotropy this composition possesses. The saturation magnetostriction $\lambda_s = 0.74\times 10^{-3}$ represents $0.9\lambda_{111}$ and demonstrates the high degree of orientation in this sample. This value of $\lambda_s$ is within 5% of the value of $\lambda_s$ calculated from our x-ray determination of the growth axis. Only one location in this sample was investigated due to the large and regular grain structure. The d constant was found to be $1.5\times 10^{-6}$ $Oe^{-1}$. These values of the d constant are to be compared with values of somewhat less than $10^{-6}$ $Oe^{-1}$ in random polycrystals.

What is claimed to be new and desired to be secured by Letters Patent of the United States is:

1. A grain-oriented polycrystalline rare earth-iron magnetostrictive material of the formula $Tb_xDy_{1-x}Fe_{2-w}$ wherein $0.20 \leq x \leq 1.00$ and $0 \leq w \leq 0.20$, wherein the grains of the material have their common principal axes substantially pointed along the growth axis of the material which is within 10° of the $\lambda_{111}$ axis.

2. The material of claim 1 wherein $0.20 \leq x \leq 0.30$.

3. The material of claim 1 wherein $0 \leq w \leq 0.10$.

4. A grain-oriented polycrystalline rare earth-iron magnetostrictive material of the formula $Tb_xHo_{1-x}Fe_{2-w}$ wherein $0.10 \leq x \leq 1$ and $0 \leq w \leq 0.20$, wherein the grains of the material have their common principal axes substantially pointed along the growth axis of the material which is within 10° of the $\lambda_{111}$ axis.

5. The material of claim 4 wherein $0.10 \leq x \leq 0.20$.

6. The material of claim 4 wherein $0 \leq w \leq 0.10$.

7. A grain-oriented polycrystalline rare earth-iron magnetostrictive material of the formula $Sm_xDy_{1-x}Fe_{2-w}$ wherein $0.80 \leq x \leq 1.00$ and $0 \leq w \leq 0.20$, wherein the grains of the material have their common principal axes substantially pointed along the growth axis of the material which is within 10° of the $\lambda_{111}$ axis.

8. The material of claim 7 wherein $0.80 \leq x \leq 0.90$.

9. The material of claim 7 wherein $0 \leq w \leq 0.10$.

10. A grain-oriented polycrystalline rare earth-iron magnetostrictive material of the formula $Sm_xHo_{1-x}Fe_{2-w}$ wherein $0.60 \leq x \leq 1.00$ and $0 \leq w \leq 0.20$, wherein the grains of the material have their common principal axes substantially pointed along the growth axis of the material which is within 10° of the $\lambda_{111}$ axis.

11. The material of claim 10 wherein $0.60 \leq x \leq 0.80$.

12. The material of claim 10 wherein $0 \leq w \leq 0.10$.

13. A grain-oriented polycrystalline rare earth-iron magnetostrictive material of the formula $Tb_xHo_yDy_zFe_{2-w}$ wherein $0.10 \leq x < 1.00$, $0 \leq y \leq 0.90$, $0 \leq z \leq 0.80$, and $0 \leq w \leq 0.20$, wherein $x+y+z=1$, and wherein the grains of the material have their common principal axes substantially pointed along the growth axis of the material which is within 10° of the $\lambda_{111}$ axis.

14. The material of claim 13 wherein $0.15 \leq x \leq 0.25$.

15. The material of claim 13 wherein $0.55 < y \leq 0.65$.

16. The material of claim 13 wherein $0.15 \leq z \leq 0.25$.

17. The material of claim 13 wherein $0 \leq w \leq 0.10$.

18. A grain-oriented polycrystalline rare earth-iron magnetostrictive material of the formula $Sm_xHo_yDy_zFe_{2-w}$ wherein $0.60 \leq x < 1.00$, $0 \leq y \leq 0.40$, $0 \leq z \leq 0.40$, and $0 \leq w \leq 0.20$, wherein $x+y+z=1$, and wherein the grains of the material have their common principal axes substantially pointed along the growth axis of the material which is within 10° of the $\lambda_{111}$ axis.

19. The material of claim 18 wherein $0.70 \leq x \leq 0.90$.

20. The material of claim 18 wherein $0.20 \leq y \leq 0.40$.

21. The material of claim 18 wherein $0 \leq z \leq 0.20$.

22. The material of claim 18 wherein $0 \leq w \leq 0.10$.

23. A single crystal rare earth-iron magnetostrictive material of the formula $TB_xDy_{1-x}Fe_{2-w}$ wherein $0.20 \leq x \leq 1.00$ and $0 \leq w \leq 0.20$ having angle grain boundaries of less than 5°, wherein the principal axis of the Laves phase is pointed along the growth axis of the material which is within 10° of the $\lambda_{111}$ axis.

24. The material of claim 23 wherein $0.20 \leq x \leq 0.30$.

25. The material of claim 23 wherein $0 \leq w \leq 0.10$.

26. A single crystal rare earth-iron magnetostrictive material of the formula $Tb_xHo_{1-x}Fe_{2-w}$ wherein $0.10 \leq x \leq 1.00$ and $0 \leq w \leq 0.20$ having angle grain boundaries of less than 5°, wherein the principal axis of the Laves phase is pointed along the growth axis of the material which is within 10° of the $\lambda_{111}$ axis.

27. The material of claim 26 wherein $0.10 \leq x \leq 0.20$.

28. The material of claim 26 wherein $0 \leq w'0.10$.

29. A single crystal rare earth-iron magnetostrictive material of the formula $Sm_xDy_{1-x}Fe_{2-w}$ wherein $0.80 \leq x \leq 1.00$ and $0 \leq w \leq 0.20$ having angle grain boundaries of less than 5°, wherein the principal axis of the Laves phase is pointed along the growth axis of the material which is within 10° of the $\lambda_{111}$ axis.

30. The material of claim 29 wherein $0.80 \leq x \leq 0.90$.

31. The material of claim 29 wherein $0 \leq w \leq 0.10$.

32. A single crystal rare earth-iron magnetostrictive material of the formula $Sm_xHo_{1-x}Fe_{2-w}$ wherein $0.60 \leq x \leq 1.00$ and $0 \leq w \leq 0.20$ having angle grain boundaries of less than 5°, wherein the principal axis of the Laves phase is pointed along the growth axis of the material which is within 10° of the $\lambda_{111}$ axis.

33. The material of claim 32 wherein $0.60 \leq x \leq 0.80$.

34. The material of claim 32 wherein $0 \leq w \leq 0.10$.

35. A single crystal rare earth-iron magnetostrictive material of the formula $Tb_xHo_yDy_zFe_{2-w}$ where $0.1 \leq x < 1.00$, $0 \leq y \leq 0.90$, $0 \leq z \leq 0.80$, and $0 \leq w \leq 0.20$, $x+y+z=1$ having angle grain boundaries of less than 5°, wherein the principal axis of the Laves phase is pointed along the growth axis of the material which is within 10° of the $\lambda_{111}$ axis.

36. The material of claim 35 wherein $0.15 \leq x \leq 0.25$.

37. The material of claim 35 wherein $0.55 \leq y \leq 0.65$.

38. The material of claim 35 wherein $0.15 \leq z \leq 0.25$.

39. The material of claim 35 wherein $0 \leq w \leq 0.1$.

40. A single crystal rare earth-iron magnetostrictive material of the formula $Sm_xHo_yDy_zFe_{2-w}$ wherein $0.60 \leq x < 1.0$, $0 \leq y \leq 0.40$, $0 \leq z \leq 0.40$, and $0 \leq w \leq 0.20$, $x+y+z=1$ having angle grain boundaries of less than 5°, wherein the principal axis of the Laves phase is pointed along the growth axis of the material which is within 10° of the $\lambda_{111}$ axis.

41. The material of claim 40 wherein $0.70 \leq x \leq 0.90$.

42. The material of claim 40 wherein $0.10 \leq y \leq 0.30$.

43. The material of claim 40 wherein $0 \leq z \leq 0.20$.

44. The material of claim 40 wherein $0 \leq w \leq 0.10$.

45. A transducer for converting magnetic energy into mechanical energy or vice versa having a magnetostrictive element comprising: a grain-oriented polycrystalline rare earth-iron magnetostrictive material of the formula $Tb_xDy_{1-x}Fe_{2-w}$ wherein $0.20 \leq x \leq 1.00$ and $0 \leq w \leq 0.20$, wherein the grains of the material have their common principal axes substantially pointed along the growth axis of the material which is within 10° of the $\lambda_{111}$ axis.

46. The transducer of claim 45 wherein $0.20 \leq x \leq 0.30$.

47. The transducer of claim 45 wherein $0 \leq w \leq 0.10$.

48. The transducer for converting magnetic energy into mechanical energy or vice versa having a magnetostrictive element comprising:
a grain-oriented polycrystalline rare earth-iron magnetostrictive material of the formula $Tb_xHo_{1-x}Fe_{2-w}$ wherein $0.10 \leq x \leq 1$ and $0 \leq w \leq 0.20$, wherein the grains of the material have their common principal axes substantially pointed along the growth axis of the material which is within 10° of the $\lambda_{111}$ axis.

49. The transducer of claim 48 wherein $0.10 \leq x \leq 0.20$.

50. The transducer of claim 48 wherein $0 \leq w \leq 0.10$.

51. A transducer for converting magnetic energy into mechanical energy or vice versa having a magnetostrictive element comprising:
a grain-oriented polycrystalline rare earth-iron magnetostrictive material of the formula $Sm_xDy_{1-x}Fe_{2-w}$ wherein $0.80 \leq x \leq 1.00$ and $0 \leq w \leq 0.20$, wherein the grains of the material have their common principal axes substantially pointed along the growth axis of the material which is within 10° of the $\lambda_{111}$ axis.

52. The transducer of claim 51 wherein $0.80 \leq x \leq 0.90$.

53. The transducer of claim 51 wherein $0 \leq w \leq 0.10$.

54. A transducer for converting magnetic energy into mechanical energy or vice versa having a magnetostrictive element comprising:
a grain-oriented polycrystalline rare earth-iron magnetostrictive material of the formula $Sm_xHo_{1-x}Fe_{2-}$ $w$ wherein $0.60 \leq x \leq 1.00$ and $0 \leq w \leq 0.20$, wherein the grains of the material have their common principal axes substantially pointed along the growth axis of the material which is within 10° of the $\lambda_{111}$ axis.

55. The transducer of claim 54 wherein $0.60 \leq x \leq 0.80$.

56. The transducer of claim 54 wherein $0 \leq w \leq 0.10$.

57. A transducer for converting magnetic energy into mechanical energy or vice versa having an magnetostrictive element comprising:
a grain-oriented polycrystalline rare earth-iron magnetostrictive material of the formula $Tb_xHo_yDy_zFe_{2-w}$ wherein $0.10 \leq x < 1.00$, $0 \leq y \leq 0.90$, $0 \leq z \leq 0.80$, and $0 \leq w \leq 0.20$, wherein $x+y+z=1$, and wherein the grains of the material have their common principal axes substantially pointed along the growth axis of the material which is within 10° of the $\lambda_{111}$ axis.

58. The transducer of claim 57 wherein $0.15 \leq x \leq 0.25$.

59. The transducer of claim 57 wherein $0.55 \leq y \leq 0.65$.

60. The transducer of claim 57 wherein $0.15 \leq z \leq 0.25$.

61. The transducer of claim 57 wherein $0 \leq w \leq 0.10$.

62. A transducer for converting magentic energy into mechanical energy or vice versa having a magnetostrictive element comprising:
a grain-oriented polycrystalline rare earth-iron magnetostrictive material of the formula $Sm_xHo_yDy_zFe_{2-w}$ wherein $0.60 \leq x \leq 1.00$, $0 \leq y \leq 0.40$, $0 \leq z \leq 0.40$, and $0 \leq w \leq 0.20$, wherein $x+y+z=1$, and wherein the grains of the material have their common principal axes substantially pointed along the growth axis of the material which is within 10° of the $\lambda_{111}$ axis.

63. The transducer of claim 62 wherein $0.70 \leq x \leq 0.90$.

64. The transducer of claim 62 wherein $0.20 \leq y \leq 0.40$.

65. The transducer of claim 62 wherein $0 \leq z \leq 0.20$.

66. The transducer of claim 62 wherein $0 \leq w \leq 0.10$.

67. A transducer for converting magnetic energy into mechanical energy or vice versa having a magnetostrictive element comprising:
a single crystal rare earth-iron magnetostrictive material of the formula $Tb_xDy_{1-x}Fe_{2-w}$ wherein $0.20 \leq x \leq 1.00$ and $0 \leq w \leq 0.20$ having angle grain boundaries of less than 5°, wherein the principal axis of the Laves phase is pointed along the growth axis of the material which is within 10°0 of the $\lambda_{111}$ axis.

68. The transducer of claim 67 wherein $0.20 \leq x \leq 0.30$.

69. The transducer of claim 67 wherein $0 \leq w \leq 0.10$.

70. A transducer for converting magnetic energy into mechanical energy or vice versa having a magnetostrictive element comprising:
a single crystal rare earth-iron magnetostrictive material of the formula $Tb_xHo_{1-x}Fe_{2-w}$ wherein $0.10 \leq x \leq 1.00$ and $0 \leq w0.20$ having angle grain boundaries of less than 5°, wherein the principal axis of the Laves phase is pointed along the growth axis of the material which is within 10° of the $\lambda_{111}$ axis.

71. The transducer of claim 70 wherein $0.10 \leq x \leq 0.20$.

72. The transducer of claim 70 wherein $0 \leq w \leq 0.10$.

73. A transducer for converting magnetic energy into mechanical energy or vice versa having a magnetostrictive element comprising:
a single crystal rare earth-iron magnetostrictive material of the formula $Sm_xDy_{1-x}Fe_{2-w}$ wherein $0.80 \leq x \leq 1.00$ and $0 \leq w \leq 0.20$ having angle grain boundaries of less than 5°, wherein the principal axis of the Laves phase is pointed along the growth axis of the material which is within 10° of the $\lambda_{111}$ axis.

74. The transducer of claim 73 wherein $0.80 \leq x \leq 0.90$.

75. The transducer of claim 73 wherein $0 \leq w \leq 0.10$.

76. A transducer for converting magnetic energy into mechanical energy or vice versa having a magnetostrictive element comprising:
a single crystal rare earth-iron magnetostrictive material of the formula $Sm_xHo_{1-x}Fe_{2-w}$ wherein $0.60 \leq x \leq 1.00$ and $0 \leq w \leq 0.20$ having angle grain boundaries of less than 5°, wherein the principal axis of the Laves phase is pointed along the growth axis of the material which is within 10° of the $\lambda_{111}$ axis.

77. The transducer of claim 76 wherein $0.60 \leq x \leq 0.80$.

78. The transducer of claim 76 wherein $0 \leq w \leq 0.10$.

79. A transducer for converting magnetic energy into mechanical energy or vice versa having a magnetostrictive element comprising:
a single crystal rare earth-iron magnetostrictive material of the formula $Tb_xHo_yDy_zFe_{2-w}$ wherein $0.1 \leq x \leq 1.00$, $0 \leq y \leq 0.90$, $0 \leq z \leq 0.80$, and $0 \leq w \leq 0.20$, $x+y+z=1$ having angle grain boundaries of less than 5°, wherein the principal axis of the Laves phase is pointed along the growth axis of the material which is within 10° of the $\lambda_{111}$ axis.

80. The transducer of claim 79 wherein $0.15 \leq x \leq 0.25$.

81. The transducer of claim 79 wherein $0.55 \leq y \leq 0.65$.

82. The transducer of claim 79 wherein $0.15 \leq z \leq 0.25$.

83. The transducer of claim 79 wherein $0 \leq w \leq 0.10$.

84. A transducer for converting magnetic energy into mechanical energy or vice versa having a magnetostrictive element comprising:
a single crystal rare earth-iron magnetostrictive material of the formula $Sm_xHo_yDy_zFe_{2-w}$ wherein $0.60 \leq x \leq 1.0$, $0 \leq y \leq 0.40$, $0 \leq z \leq 0.40$, and $0 \leq w \leq 0.20$, $x+y+z=1$ having angle grain boundaries of less than 5°, wherein the principal axis of the Laves phase is pointed along the growth axis of the material which is within 10° of the $\lambda_{111}$ axis.

85. The transducer of claim 84 wherein $0.70 \leq x \leq 0.90$.

86. The transducer of claim 84 wherein $0.20 \leq y \leq 0.40$.

87. The transducer of claim 84 wherein $0 \leq z \leq 0.20$.

88. The transducer of claim 84 wherein $0 \leq w \leq 0.10$.

89. A device for varying the velocity of sound waves comprising:
(1) a sound wave transmission element comprising a grain-oriented polycrystalline magnetostrictive material selected from the group consisting of
(a) $Tb_xDy_{1-x}Fe_{2-w}$ wherein $0.20 \leq x \leq 1.00$;

(b) $Tb_xHo_{1-x}Fe_{2-w}$ wherein $0.10 \leq x \leq 1.00$;
(c) $Sm_xDy_{1-x}Fe_{2-w}$ wherein $0.80 \leq x \leq 1.00$;
(d) $Sm_xHo_{1-x}Fe_{2-w}$ wherein $0.60 \leq x \leq 1.00$;
(e) $Tb_xHo_yDy_zFe_{2-w}$ wherein $0.10 \leq x \leq 1.00$; 0 y 0.90, 0 z 0.80, and $x+y+z=1$; and
(f) $Sm_xHo_yDy_zFe_{2-w}$ wherein $0.60x<1.00$, $0 \leq y \leq 0.40$, $0 \leq z \leq 0.40$, and $x+y+z=1$;
wherein $0 \leq w \leq 0.20$ for (a) through (f) and wherein the grains of the material have their common principal axis substantially pointed along the growth axis of the material which is within 10° of the $\lambda_{111}$ axis; and (2) means for generating a magnetic field of adjustable strength in the transmission element.

90. The device of claim 89 wherein the material comprises $Tb_xDy_{1-x}Fe_{2-w}$ wherein $0.20 \leq x \leq 0.30$ and $0 \leq w \leq 0.10$.

91. The device of claim 89 wherein the material comprises $Tb_xHo_{1-x}Fe_{2-w}$ wherein $0.10 \leq x \leq 0.20$ and $0 \leq w \leq 0.10$.

92. The device of claim 89 wherein the material comprises $Sm_xDy_{1-x}Fe_{2-w}$ wherein $0.80 \leq x \leq 0.90$ and $0 \leq w \leq 0.10$.

93. The device of claim 89 wherein the material comprises $Sm_xHo_{1-x}Fe_{2-w}$ wherein $0.60 \leq x \leq 0.80$ and $0 \leq w \leq 0.10$.

94. The device of claim 89 wherein the material comprises $Tb_xHo_yDy_zFe_{2-w}$ wherein $0.15 \leq x \leq 0.25$, $0.55 \leq y \leq 0.65$, $0.15 \leq x \leq 0.25$, and $0 \leq w \leq 0.10$.

95. The device of claim 89 wherein the material comprises $Sm_xHo_yDy_zFe_{2-w}$ wherein $0.70 \leq x \leq 0.90$, $0.20 \leq y \leq 0.40$, $0 \leq z \leq 0.20$, and $0 \leq w \leq 0.10$.

96. A device for varying the velocity of sound waves comprising:

(1) a sound wave transmission element comprising a single crystal of a magnetostrictive material selected from the group consisting of
(a) $Tb_xDy_{1-x}Fe_{2-w}$ wherein $0.20 \leq x \leq 1.00$;
(b) $Tb_xHo_{1-x}Fe_{2-w}$ wherein $0.10 \leq x \leq 1.00$;
(c) $Sm_xDy_{1-x}Fe_{2-w}$ wherein $0.80 \leq x \leq 1.00$;
(d) $Sm_xHo_{1-x}Fe_{2-w}$ wherein $0.60 \leq x \leq 1.00$;
(e) $Tb_xHo_yDy_zFe_{2-w}$ wherein $0.10 \leq x < 1.00$, $0 \leq y \leq 0.90$, $0 \leq z \leq 0.80$, and $x+y+z=1$; and
(f) $Sm_xHo_yDy_zFe_{2-w}$ wherein $0.60 \leq x < 1.00$, $0 \leq y \leq 0.40$, $0 \leq z \leq 0.40$, and $x+y+z=1$; wherein $0 \leq w \leq 0.20$ for (a) through (f) having angle grain boundaries of less than 5°, wherein the principal axis of the Laves phase is pointed along the growth axis of the material which is within 10° of the $_{111}$ axis; and (2) means for generating a magnetic field of adjustable strength in the transmission element.

97. The device of claim 96 wherein the material comprises $Tb_xDy_{1-x}Fe_{2-w}$ wherein $0.20 \leq x \leq 0.30$ and $0 \leq w \leq 0.10$.

98. The device of claim 96 wherein the material comprises $Tb_xHo_{1-x}Fe_{2-w}$ wherein $0.10 \leq x \leq 0.20$ and $0 \leq w \leq 0.10$.

99. The device of claim 96 wherein the material comprises $Sm_xDy_{1-x}Fe_{2-w}$ wherein $0.80 \leq x \leq 0.90$ and $0 \leq w \leq 0.10$.

100. The device of claim 96 wherein the material comprises $Sm_xHo_{1-x}Fe_{2-w}$ wherein $0.60 \leq x \leq 0.80$ and $0 \leq w \leq 0.10$.

101. The device of claim 96 wherein the material comprises $Tb_xHo_yDy_zFe_{2-w}$ wherein $0.15 \leq x \leq 0.25$, $0.55 \leq y \leq 0.65$, $0.15 \leq x \leq 0.25$, and 0 w 0.10.

102. The device of claim 96 wherein the material comprises $Sm_xHo_yDy_zFe_{2-w}$ wherein $0.70 \leq x \leq 0.90$, $0.20 \leq y \leq 0.40$, $0 \leq z \leq 0.20$, and $0 \leq w \leq 0.10$.

* * * * *